United States Patent
Chiu et al.

(10) Patent No.: US 12,381,559 B2
(45) Date of Patent: Aug. 5, 2025

(54) INPUT/OUTPUT CIRCUIT

(71) Applicant: UNITED MICROELECTRONICS CORP., Hsinchu (TW)

(72) Inventors: Pei-Shin Chiu, Hsinchu (TW);
Te-Chang Wu, Hsinchu County (TW);
Chih-Yuan Chung, Hsinchu (TW);
Wen-Ching Huang, Hsinchu County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 281 days.

(21) Appl. No.: 18/127,275

(22) Filed: Mar. 28, 2023

(65) Prior Publication Data
US 2024/0297650 A1 Sep. 5, 2024

(30) Foreign Application Priority Data

Mar. 1, 2023 (TW) .................. 112107306

(51) Int. Cl.
*H03K 19/0185* (2006.01)
*H03K 19/003* (2006.01)
(52) U.S. Cl.
CPC ............ *H03K 19/018521* (2013.01); *H03K 19/00315* (2013.01); *H03K 19/018585* (2013.01)

(58) Field of Classification Search
None
See application file for complete search history.

(56) References Cited

U.S. PATENT DOCUMENTS

| | | |
|---|---|---|
| 2004/0027159 A1 | 2/2004 | Oertle |
| 2004/0119526 A1* | 6/2004 | Ajit .................. H03K 19/00315 327/536 |

* cited by examiner

*Primary Examiner* — Jany Richardson
(74) *Attorney, Agent, or Firm* — WPAT, PC

(57) ABSTRACT

An input/output circuit (I/O circuit) includes the following elements. An input/output pad (I/O pad) has a plurality of operation mode, including an output mode, a normal input mode and a tolerance mode of an input mode. A first control circuit provides a first control signal in response to a pad voltage of the I/O pad and a supply voltage. A first P-type transistor has a first body region to receive a first control signal. A second P-type transistor has a second body region to receive the first control signal. In the input mode, when the pad voltage is lower than or equal to the supply voltage, the I/O pad operates in the normal input mode, and, when the pad voltage is higher than the supply voltage, the I/O pad operates in the tolerance mode, and voltage of the first control signal is equal to pad voltage.

13 Claims, 9 Drawing Sheets

INPUT/OUTPUT CIRCUIT

This application claims the benefit of Taiwan application Serial No. 112107306, filed Mar. 1, 2023, the subject matter of which is incorporated herein by reference.

TECHNICAL FIELD

The disclosure relates to an electronic circuit, and more particularly, relates to an input/output circuit (I/O circuit) for controlling an input/output pad (I/O pad) with multiple operating modes.

BACKGROUND

In the circuit design of the input/output pad (I/O pad), an inverter configuration is utilized to control the I/O pad to input or output logic value "1" or logic value "0". The inverter configuration may include P-type transistors and N-type transistors for driving the I/O pad. According to the characteristics of the semiconductor device of the P-type transistor, the junction breakdown voltage of the P-type transistor is relatively low.

In non-ideal conditions, undesirable currents may be generated around the I/O pads, such as surge currents or Electro Static Discharge (ESD) currents. Since the junction breakdown voltage of the P-type transistor is relatively low, when the cross voltage of the P-N junction of the P-type transistor is higher than the junction breakdown voltage, the above-mentioned undesirable current may flow through the P-type transistor, and further flow into other components of the I/O circuit (such as power supply) through the P-type transistor, and damage may be caused.

Another P-type transistor may be added, and the two P-type transistors form a cascade configuration, so as to reduce the possibility for undesirable currents to flow into other components through the P-type transistor. However, when the I/O pad with multiple operating modes operates in the input mode, and the pad voltage of the I/O pad is higher than the supply voltage, it may degrade the reliability of the cascaded P-type transistors, resulting in abnormality of the I/O pad.

In view of the above technical problems, it is necessary to improve the I/O circuit, such that reliability of the cascaded P-type transistors may be enhanced.

SUMMARY

According to an aspect of the present disclosure, an input/output circuit (I/O circuit) is provided. The I/O circuit includes an input/output pad (I/O pad), a first control circuit, a first P-type transistor and a second P-type transistor. The I/O pad has a pad voltage, and having a plurality of operating modes, the operating modes comprise an input mode and an output mode, and the input mode comprises a normal input mode and a tolerance mode. The first control circuit provides a first control signal in response to the pad voltage and a supply voltage. The first P-type transistor has a first source, a first drain, a first gate and a first body region, the first source receives the supply voltage, and the first body region receives the first control signal. The second P-type transistor has a second source, a second drain, a second gate and a second body region, the second source is connected to the first drain of the first P-type transistor, the second drain is connected to the I/O pad, the second body region receives the first control signal. In the input mode, when the pad voltage is lower than or equal to the supply voltage, the I/O pad operates in the normal input mode, and when the pad voltage is higher than the supply voltage, the I/O pad operates in the tolerance mode, a voltage of the first control signal is equal to the pad voltage.

Figure 1:
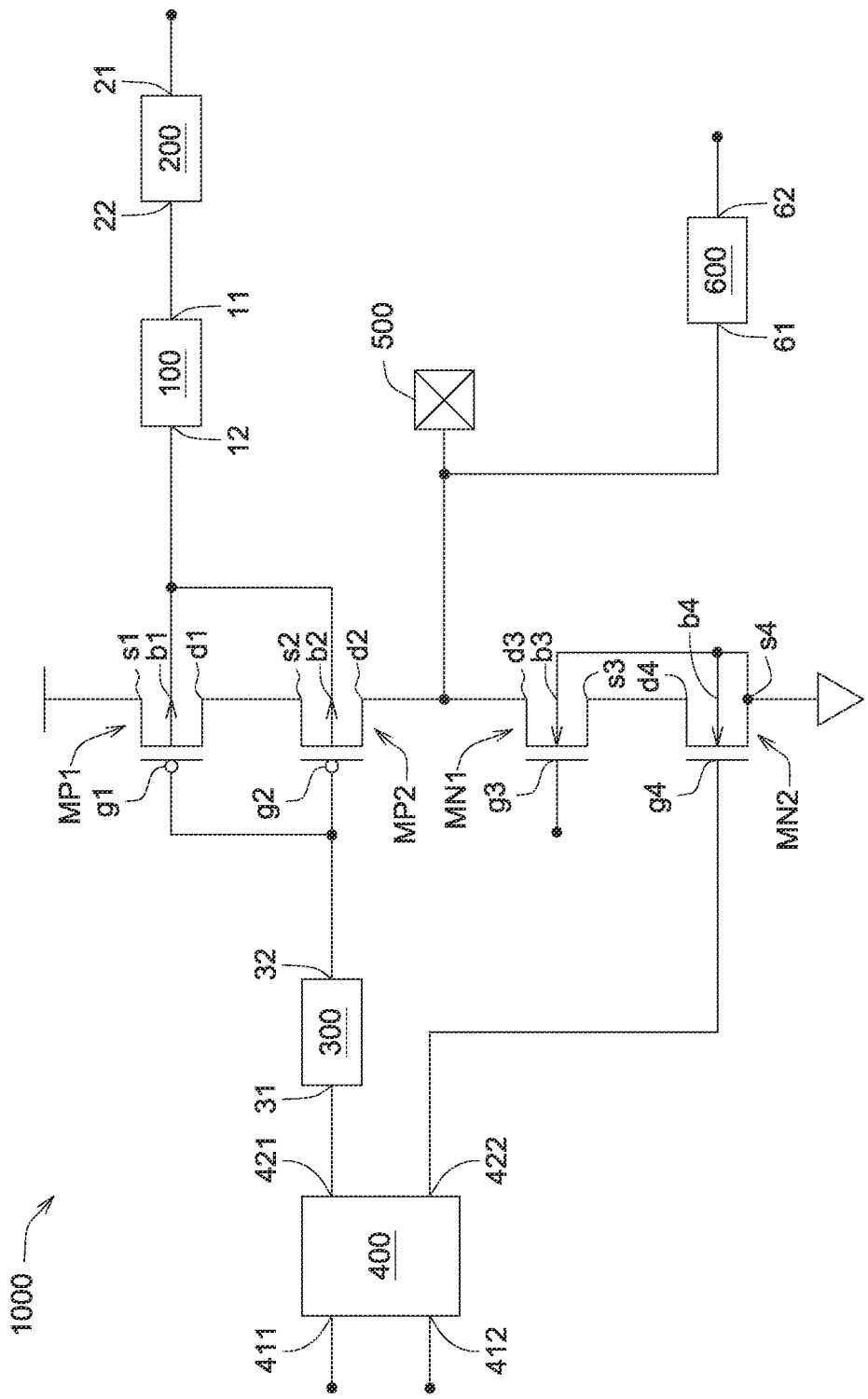
FIG. 1 is a circuit diagram of an input/output circuit (I/O circuit) 1000 according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically illustrated in order to simplify the drawing.

DETAILED DESCRIPTION

FIG. 1 is a circuit diagram of an input/output circuit (I/O circuit) 1000 according to an embodiment of the disclosure. As shown in FIG. 1, the I/O circuit 1000 includes an I/O pad 500, a first P-type transistor MP1, a second P-type transistor MP2, a first N-type transistor MN1, a second N-type transistor MN2, the first control circuit 100, the second control circuit 200, the third control circuit 300 and the driving circuit 400.

The first P-type transistor MP1 has a first drain d1, a first source s1, a first gate g1 and a first body region b1. The second P-type transistor MP2 has a second drain d2, a second source s2, a second gate g2 and a second body region b2. The first N-type transistor MN1 has a third drain d3, a third source s3, a third gate g3 and a third body region b3. The second N-type transistor MN2 has a fourth drain d4, a fourth source s4, a fourth gate g4 and a fourth body region b4.

The driving circuit 400 has a first input end 411, a second input end 412, a first output end 421 and a second output end 422. The first control circuit 100 has a first input end 11 and a first output end 12. The second control circuit 200 has a first input end 21 and a first output end 22. The third control circuit 300 has a first input end 31 and a first output end 32. The fourth control circuit 600 has a first input end 61 and a first output end 62.

Regarding the circuit connection of the I/O circuit 1000, the first P-type transistor MP1 is connected with the second P-type transistor MP2 in series. The first drain d1 of the first P-type transistor MP1 is connected to the second source s2 of the second P-type transistor, and the first gate g1 of the first P-type transistor MP1 is connected to the second gate g2 of the second P-type transistor, and the first gate g1 and the second gate g2 are commonly connected to the first output end 32 of the third control circuit 300. The first body region b1 of the first P-type transistor MP1 is connected to the second body region b2 of the second P-type transistor, and the first body region b1 and the second body region b2 are commonly connected to the first output end 12 of the first control circuit 100. The first input end 11 of the first control circuit 100 is connected to the first output end 22 of the second control circuit 200. The first input end 61 of the fourth control circuit 600 is connected to the I/O pad 500.

On the other hand, the second drain d2 of the second P-type transistor MP2 is connected to the third drain d3 of the first N-type transistor MN1, and the second drain d2 and the third drain d3 are commonly connected on the I/O pad 500. The third source s3 of the first N-type transistor MN1 is connected to the fourth drain d4 of the second N-type transistor MN2. The third body region b3 of the first N-type transistor MN1 and the fourth body region b4 of the second N-type transistor MN2 are commonly connected to the fourth source s4. The fourth gate g4 of the second N-type transistor MN2 is connected to the second output end 422 of the driving circuit 400.

Figure 2:
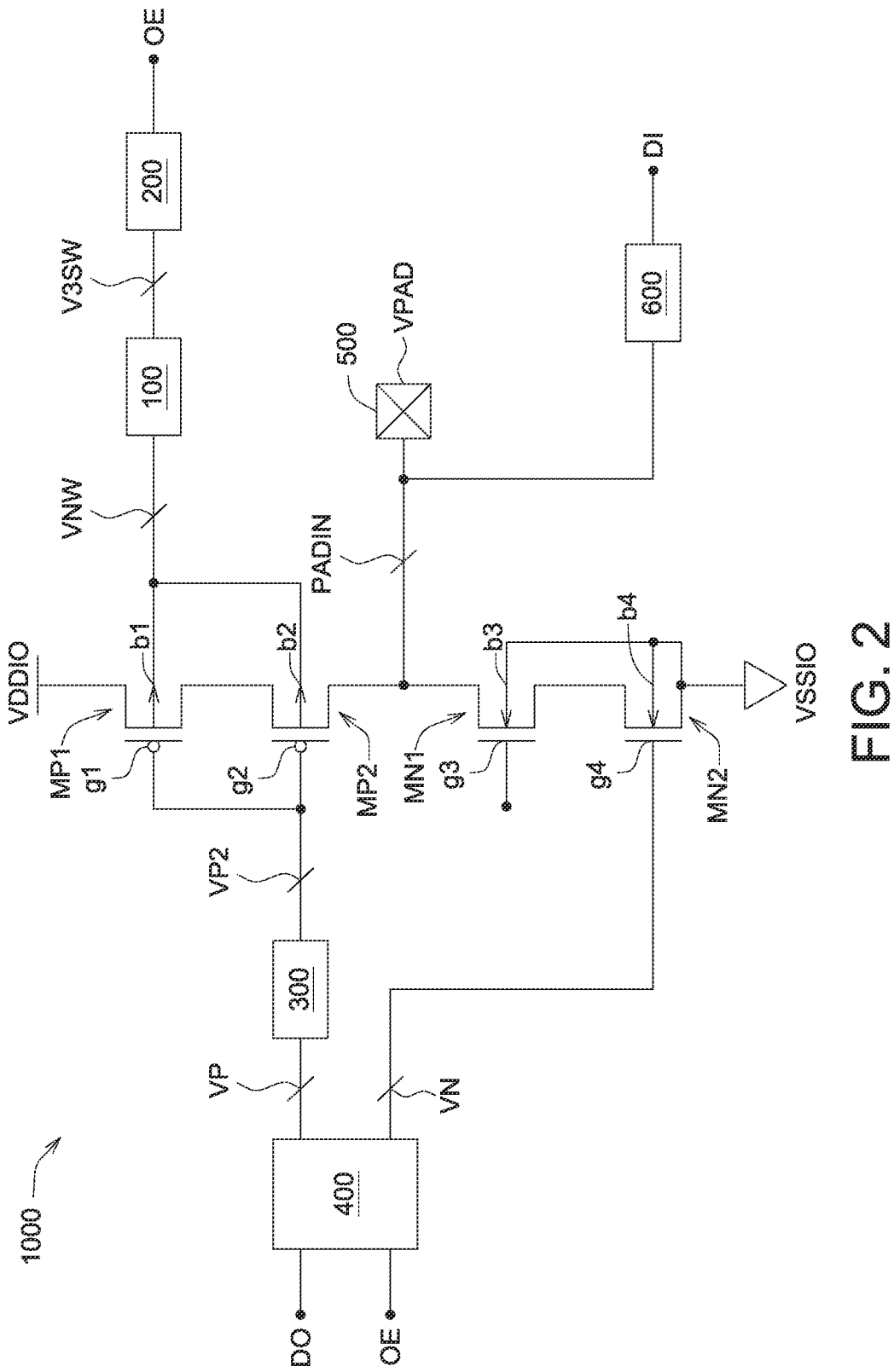
FIG. 2 is a schematic diagram of control signals of the I/O circuit 1000 in FIG. 1.

FIG. 2 is a schematic diagram of control signals of the I/O circuit 1000 in FIG. 1. As shown in FIG. 2 (and referring to FIG. 1 in conjunction), the first input end 411 of the driving circuit 400 receives the output data signal DO. The second input end 412 of the driving circuit 400 receives the output enable signal OE. The first output end 421 of the driving circuit 400 provides a first gate signal VP. The second output end 422 of the driving circuit 400 provides the third gate signal VN. The third gate signal VN is provided to the fourth gate g4 of the second N-type transistor MN2.

The first input end 31 of the third control circuit 300 receives the first gate signal VP, and the first output end 32 of the third control circuit 300 provides the second gate signal VP2. The second gate signal VP2 is provided to the first gate g1 of the first P-type transistor MP1 and the second gate g2 of the second P-type transistor MP2. The first input end 21 of the second control circuit 200 receives the output enable signal OE, and the first output end 22 of the second control circuit 200 provides the second control signal V3SW. The first input end 11 of the first control circuit 100 receives the second control signal V3SW, and the first output end 12 of the first control circuit 100 provides the first control signal VNW. The first control signal VNW is provided to the first body region b1 of the first P-type transistor MP1 and the second body region b2 of the second P-type transistor MP2. The first input end 61 of the fourth control circuit 600 receives the first input signal PADIN of the I/O pad 500, and the first output end 62 of the fourth control circuit 600 provides the input data signal DI. The pad voltage VPAD of the I/O pad 500 is equal to the voltage of the first input signal PADIN.

The first source s1 of the first P-type transistor MP1 receives a supply voltage VDDIO. The supply voltage VDDIO is e.g., 3V. The third body region b3 of the first N-type transistor MN1, the fourth body region b4 and the fourth source s4 of the second N-type transistor MN2 receive the ground voltage VSSIO. The ground voltage VSSIO is e.g., 0V. The ground voltage VSSIO is lower than the supply voltage VDDIO.

The I/O pad 500 has multiple operating modes, and these operating modes include an output mode and an input mode. Furthermore, the input mode includes a normal input mode and a tolerance mode. The detailed operation of the I/O circuit 1000 corresponding to each operating mode of the I/O pad 500, will be described below.

Figure 3A:
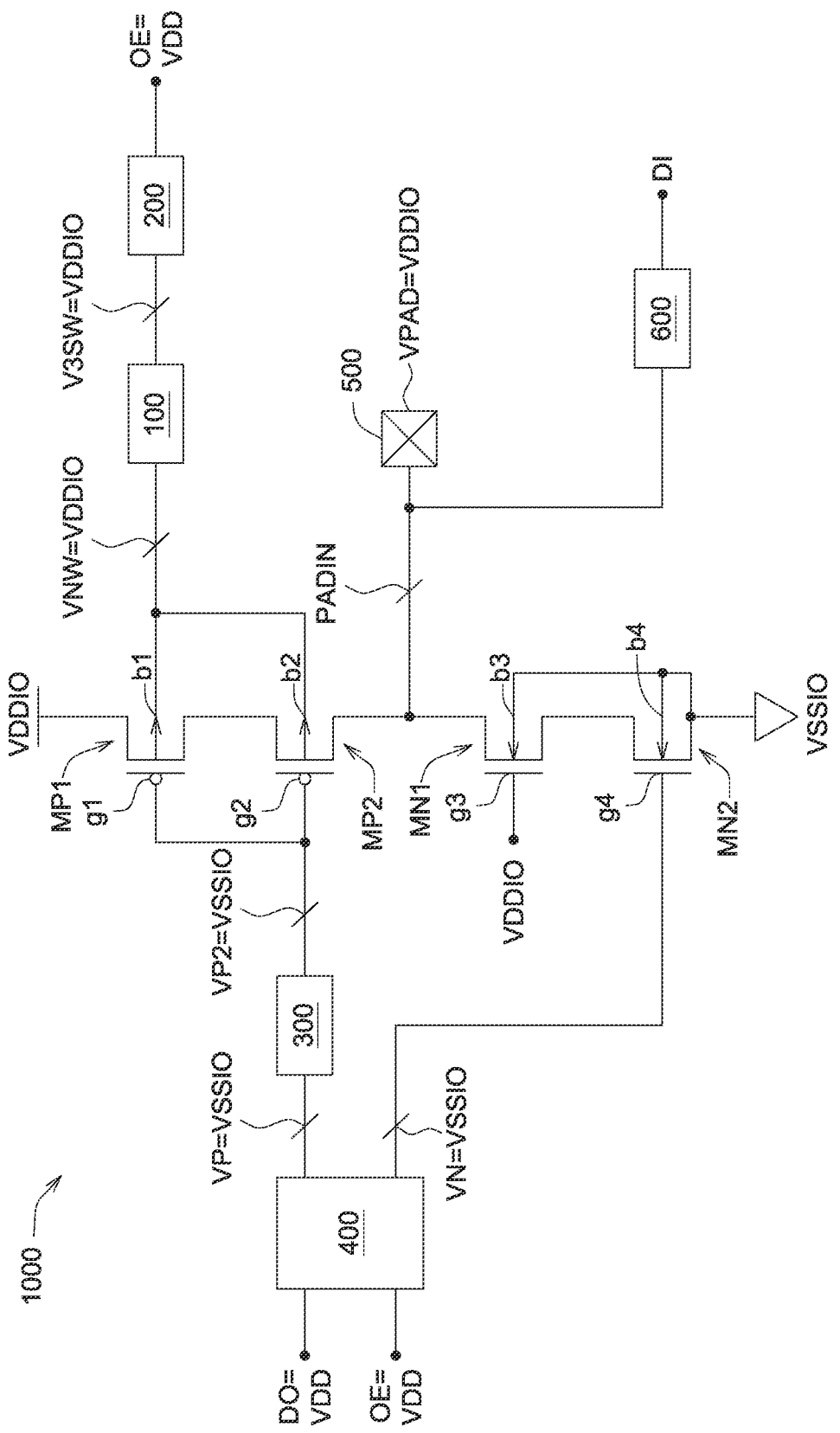
FIGS. 3A and 3B are schematic diagrams of one embodiment of operation of the I/O circuit 1000, corresponding to the output mode of the I/O pad 500.
Figure 3B:
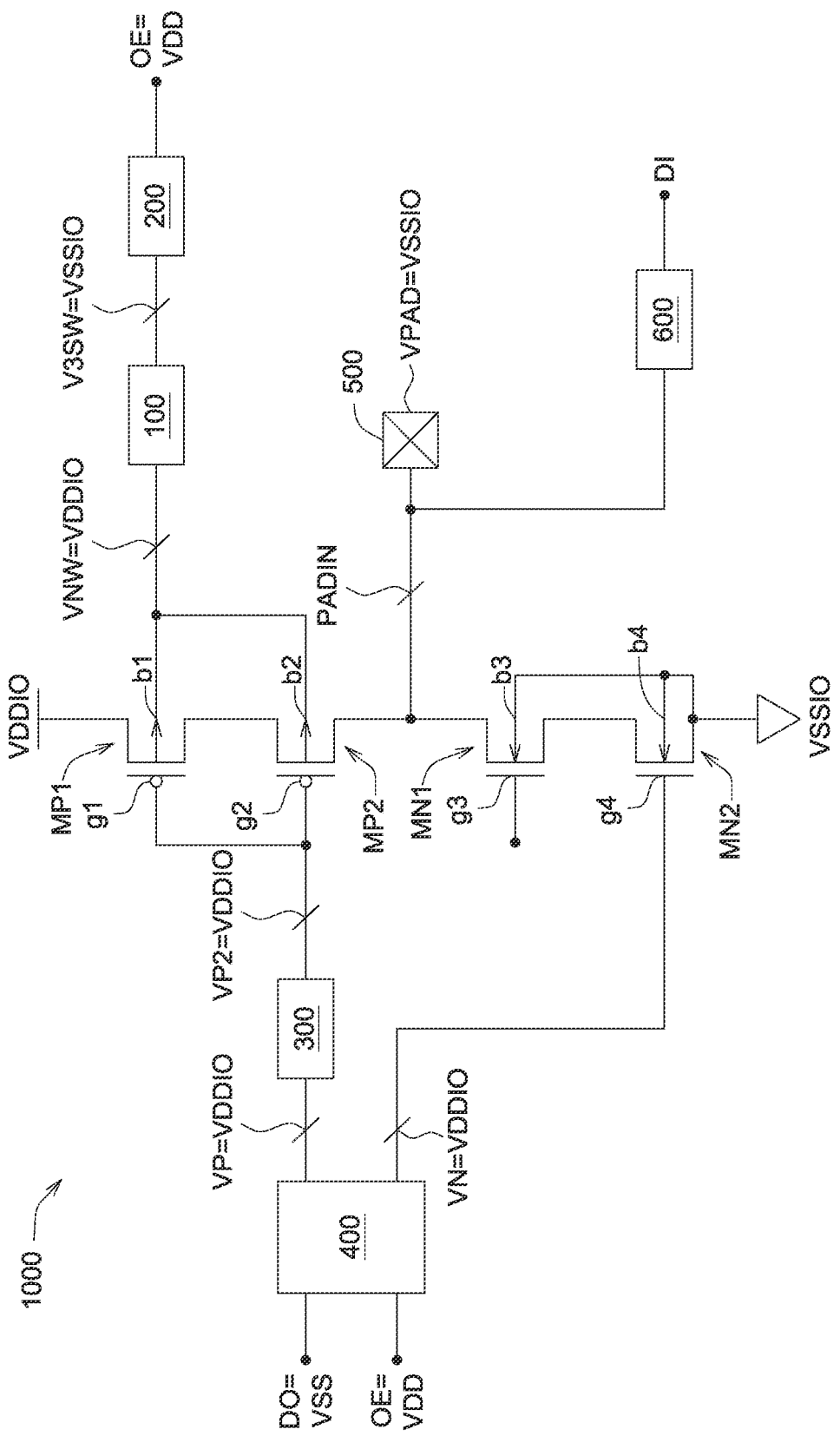

FIGS. 3A and 3B are schematic diagrams of one embodiment of operation of the I/O circuit 1000, corresponding to the output mode of the I/O pad 500. Firstly, please refer to FIG. 3A, when the I/O pad 500 operates in the output mode, intending to output a logic value "1" through the I/O pad 500, the voltage of the output enable signal OE received by the driving circuit 400 and the voltage of the output data signal DO are equal to the first voltage VDD. The first voltage VDD is e.g., 2.5V. In response to the output enable signal OE and the output data signal DO having voltage equal to the first voltage VDD, the voltages of the first gate signal VP and the third gate signal VN provided by the driving circuit 400 are both equal to the ground voltage VSSIO. The third control circuit 300 receives the first gate signal VP and provides a second gate signal VP2, the voltage of the second gate signal VP2 is equal to the ground voltage VSSIO.

The first gate g1 of the first P-type transistor MP1 and the second gate g2 of the second P-type transistor MP2 receive the second gate signal VP2. Since the voltage of the second gate signal VP2 is equal to the ground voltage VSSIO, the first P-type transistor MP1 and the second P-type transistor MP2 are both in the turned ON state. On the other hand, the fourth gate g4 of the second N-type transistor MN2 receives the third gate signal VN. Since the voltage of the third gate signal VN is equal to the ground voltage VSSIO, the second N-type transistor MN2 is in the turned OFF state. Therefore, the pad voltage VPAD of the I/O pad 500 is raised to as being equal to the supply voltage VDDIO through the first P-type transistor MP1 and second P-type transistor MP2 which are turned ON, and the pad voltage VPAD of the I/O pad 500 is equal to the supply voltage VDDIO, then the logic value "1" is outputted through the I/O pad 500.

Meanwhile, the second control circuit 200 receives the output enable signal OE, and the second control circuit 200 provides the second control signal V3SW to the first control circuit 100. The first control circuit 100 provides the first control signal VNW to the first body region b1 of the first P-type transistor MP1 and the second body region b2 of the second P-type transistor MP2. In response to the output enable signal OE having a voltage equal to the first voltage VDD, the voltage of the second control signal V3SW is equal to the ground voltage VSSIO, and the voltage of the first control signal VNW is equal to the supply voltage VDDIO. Accordingly, the voltages of the first body region b1 of the first P-type transistor MP1 and the second body region b2 of the second P-type transistor MP2 may be raised to as being equal to the supply voltage VDDIO.

Next, referring to FIG. 3B, when the I/O pad 500 operates in the output mode, intending to output a logic value "0" through the I/O pad 500, the voltage of the output enable signal OE received by the driving circuit 400 is equal to the first voltage VDD, the voltage of the output data signal DO received by the driving circuit 400 is equal to the second voltage VSS, the second voltage VSS is e.g., 0V, and the second voltage VSS is lower than the first voltage VDD. The voltages of the first gate signal VP and the third gate signal VN provided by the driving circuit 400 are both equal to the supply voltage VDDIO. The voltage of the second gate signal VP2 provided by the third control circuit 300 is equal to the supply voltage VDDIO.

Since the voltage of the second gate signal VP2 is equal to the supply voltage VDDIO, the first P-type transistor MP1 and the second P-type transistor MP2 are in a turned OFF state. On the other hand, the third gate g3 of the first N-type transistor MN1 receives the supply voltage VDDIO, and the voltage of the third gate signal VN received by the fourth gate g4 of the second N-type transistor MN2 is equal to the supply voltage VDDIO, therefore, both the first N-type transistor MN1 and the second N-type transistor MN2 are turned ON. The pad voltage VPAD of the I/O pad 500 is reduced to as being equal to the ground voltage VSSIO through the first N-type transistor MN1 and the second N-type transistor MN2 which are turned ON, and the pad voltage VPAD of the I/O pad 500 is equal to the ground voltage VSSIO, then, a logic value "0" is outputted through the I/O pad 500.

Meanwhile, the second control circuit 200 receives the output enable signal OE, and the voltage of the output enable signal OE is equal to the first voltage VDD. The voltage of the second control signal V3SW is equal to the ground voltage VSSIO, and the voltage of the first control signal VNW is equal to the supply voltage VDDIO. Accordingly, the voltages of the first body region b1 of the first P-type transistor MP1 and the second body region b2 of the second P-type transistor MP2 may be raised to as being equal to the supply voltage VDDIO.

Figure 4A:
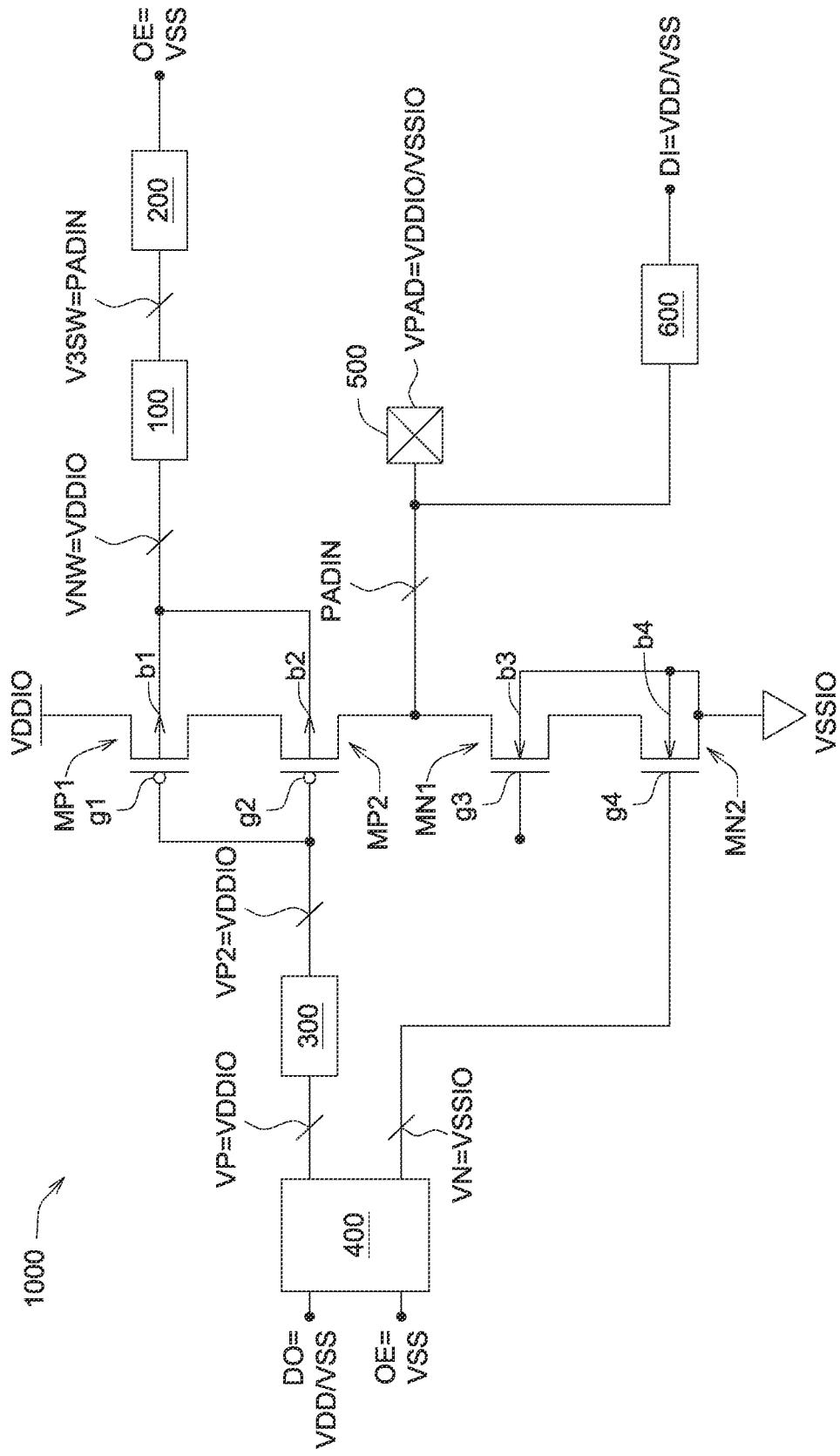
FIG. 4A is a schematic diagram of another embodiment of operation of the I/O circuit 1000, corresponding to the normal input mode of the I/O pad 500.

FIG. 4A is a schematic diagram of another embodiment of operation of the I/O circuit 1000, corresponding to the normal input mode of the I/O pad 500 (i.e., the normal input mode is included in the input mode). As shown in FIG. 4A, when the pad voltage VPAD of the I/O pad 500 is lower than or equal to the supply voltage VDDIO (i.e., when the voltage of the first input signal PADIN is lower than or equal to the supply voltage VDDIO), the I/O pad 500 operates in the normal input mode (i.e., the normal input mode is included in the input mode). For example, when the pad voltage VPAD of the I/O pad 500 is equal to the supply voltage VDDIO or the ground voltage VSSIO, the I/O pad 500 operates in the normal input mode.

According to the normal input mode of the I/O pad 500, the voltage of the output enable signal OE received by the driving circuit 400 is equal to the second voltage VSS. The voltage of the first gate signal VP provided by the driving circuit 400 is equal to the supply voltage VDDIO, and the voltage of the third gate signal VN provided by the driving circuit 400 is equal to the ground voltage VSSIO. The voltage of the second gate signal VP2 provided by the third control circuit 300 is equal to the supply voltage VDDIO.

Both the first gate g1 of the first P-type transistor MP1 and the second gate g2 of the second P-type transistor MP2 receive the second gate signal VP2. Since the voltage of the second gate signal VP2 is equal to the supply voltage VDDIO, the first P-type transistor MP1 and the second P-type transistor MP2 are in a turned OFF state. On the other hand, the voltage of the third gate signal VN received by the fourth gate g4 of the second N-type transistor MN2 is equal to the ground voltage VSSIO, therefore, the second N-type transistor MN2 is in a turned OFF state. When the pad voltage VPAD of the I/O pad 500 is equal to the supply voltage VDDIO, it indicates that a logic value "1" is inputted through the I/O pad 500, and the voltage of the first input signal PADIN is equal to the supply voltage VDDIO. According to the received first input signal PADIN, the voltage of the input data signal DI provided by the fourth control circuit 600 is equal to the first voltage VDD, and the input data signal DI represents a logic value "1".

On the other hand, when the pad voltage VPAD of the I/O pad 500 is equal to the ground voltage VSSIO, it indicates that the logic value "0" is inputted through the I/O pad 500, and the voltage of the first input signal PADIN is equal to the ground voltage VSSIO. The voltage of the input data signal DI provided by the fourth control circuit 600 is equal to the second voltage VSS, and the input data signal DI represents a logic value "0".

Meanwhile, the voltage of the output enable signal OE received by the second control circuit 200 is equal to the second voltage VSS. The voltage of the second control signal V3SW is equal to the voltage of the first input signal PADIN, and the voltage of the first control signal VNW is equal to the supply voltage VDDIO. Both the first body region b1 of the first P-type transistor MP1 and the second body region b2 of the second P-type transistor MP2 receive the first control signal VNW. Accordingly, the voltages of the first body region b1 of the first P-type transistor MP1 and the second body region b2 of the second P-type transistor MP2 may be raised to as being equal to the supply voltage VDDIO.

Both the first gate g1 of the first P-type transistor MP1 and the second gate g2 of the second P-type transistor MP2 receive the second gate signal VP2, corresponding to the normal input mode of the I/O pad 500, and the voltage of the second gate signal VP2 is equal to the supply voltage VDDIO. Moreover, both the first body region b1 of the first P-type transistor MP1 and the second body region b2 of the second P-type transistor MP2 receive the first control signal VNW, corresponding to the normal input mode of the I/O pad 500, the voltage of the first control signal VNW is equal to the supply voltage VDDIO. According to the above-mentioned embodiment, in the input mode of the I/O pad 500, a change of the voltage value of the first gate g1 of the first P-type transistor MP1 and a change of the voltage value of the second gate g2 of the second P-type transistor MP2 are synchronized with a change of the voltage value of the first body region b1 of the first P-type transistor MP1 and a change of the voltage value of the second body region b2 of the second P-type transistor MP2.

Figure 4B:
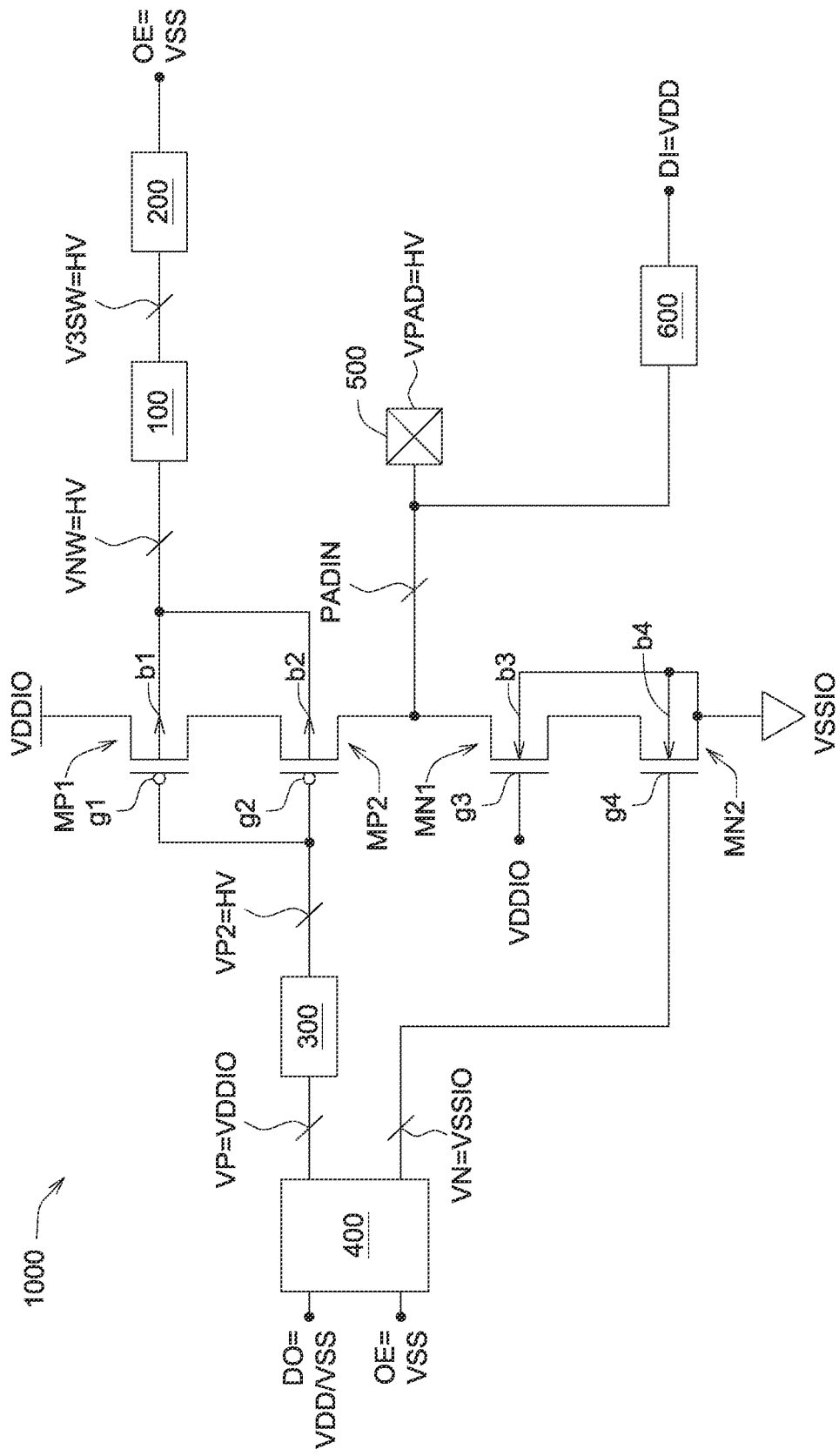
FIG. 4B is a schematic diagram of another embodiment of operation of the I/O circuit 1000, corresponding to a tolerance mode of the input mode of the I/O pad 500.

FIG. 4B is a schematic diagram of another embodiment of operation of the I/O circuit 1000, corresponding to a tolerance mode of the input mode of the I/O pad 500. As shown in FIG. 4B, when the pad voltage VPAD of the I/O pad 500 is higher than the supply voltage VDDIO (i.e., when the voltage of the first input signal PADIN is higher than the supply voltage VDDIO), it may cause the cross voltage of the P-N junction of the first P-type transistor MP1 and the second P-type transistor MP2 be higher than the junction breakdown voltage, causing a current to flow into the power supply (not shown in FIG. 4B) or other components of the I/O circuit 1000 through the first P-type transistor MP1 or the second P-type transistor MP2 and resulting in damage. Therefore, when the pad voltage VPAD of the I/O pad 500 is equal to the third voltage HV, and the third voltage HV is higher than the supply voltage VDDIO, the I/O pad 500 operates in the tolerance mode (i.e., the tolerance mode is included in the input mode).

The pad voltage VPAD of the I/O pad 500 is equal to the third voltage HV, and the voltage of the first input signal PADIN is equal to the third voltage HV. The voltage of the output enable signal OE is equal to the second voltage VSS, and the voltage of the second gate signal VP2 provided by the third control circuit 300 is equal to the third voltage HV.

Both the first gate g1 of the first P-type transistor MP1 and the second gate g2 of the second P-type transistor MP2 receive the second gate signal VP2, therefore, the voltage of the first gate g1 of the first P-type transistor MP1 and the voltage of the second gate g2 of the second P-type transistor MP2 are equal to the third voltage HV.

On the other hand, the voltage of the second control signal V3SW provided by the second control circuit 200 is equal to the third voltage HV, and the voltage of the first control signal VNW provided by the first control circuit 100 is equal to the third voltage HV. Both the first body region b1 of the first P-type transistor MP1 and the second body region b2 of the second P-type transistor MP2 receive the first control signal VNW, therefore, the voltage of the first body region b1 of the first P-type transistor MP1 and the voltage of the second body region b2 of the second P-type transistor MP2 are equal to the third voltage HV.

According to the above-mentioned embodiment, in the input mode of the I/O pad 500, the change of the voltage value of the first gate g1 of the first P-type transistor MP1 and the change of the voltage value of the second gate g2 of the second P-type transistor MP2 are synchronous with the change of the voltage value of the first body region b1 of the first P-type transistor MP1 and the change of the voltage value of the second body region b2 of the second P-type transistor MP2. Moreover, in the tolerance mode (which is included in the input mode), the voltages of the first gate g1 and the first body region b1 of the first P-type transistor MP1 and the voltages of the second gate g2 and the second body region b2 of the second P-type transistor MP2 are all raised to as being equal to the third voltage HV. Therefore, it may prevent the cross voltage of the P-N junction of the first P-type transistor MP1 and the second P-type transistor MP2 from being higher than the junction breakdown voltage that will cause current to flow into the power supply of the I/O circuit 1000 (not shown) or other components.

Figure 5A:
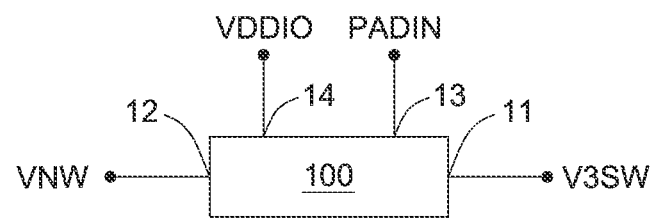
FIG. 5A is a block diagram of the first control circuit 100 of the I/O circuit 1000 of FIG. 1.

FIG. 5A is a block diagram of the first control circuit 100 of the I/O circuit 1000 of FIG. 1. Referring to FIG. 5A, in addition to the first input end 11 and the first output end 12, the first control circuit 100 further has a second input end 13 and a third input end 14. The first input end 11 of the first control circuit 100 receives the second control signal V3SW, the second input end 13 receives the first input signal PADIN, the third input end 14 receives the supply voltage VDDIO, and the first output end 12 provides the first control signal. VNW.

Figure 5B:
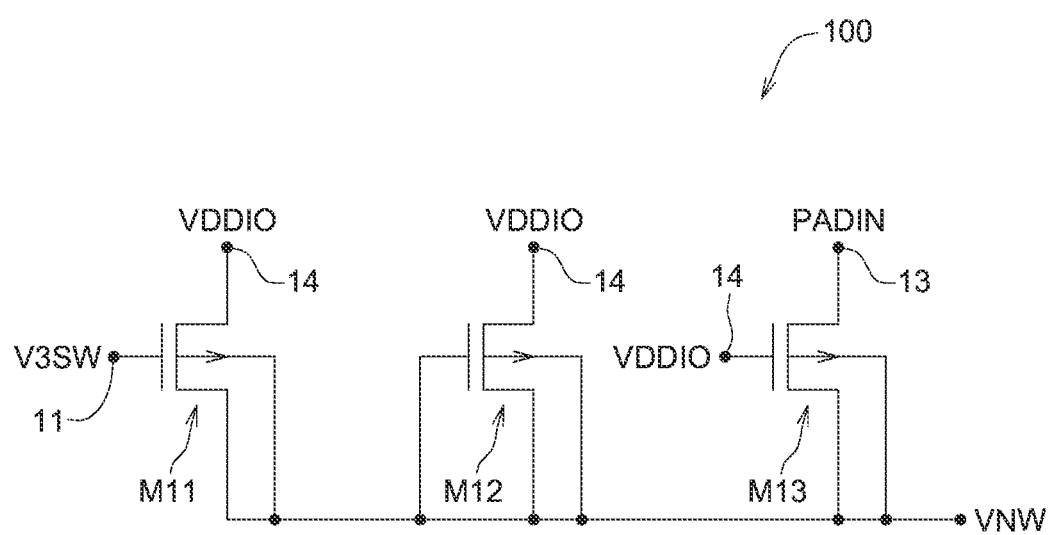
FIG. 5B is a circuit diagram of the first control circuit 100 in FIG. 5A.

FIG. 5B is a circuit diagram of the first control circuit 100 in FIG. 5A. Referring to FIG. 5B, the first control circuit 100 includes three transistors M11~M13. Each of the transistors M11~M13 is i.e., a P-type transistor. The gate of the transistor M11 is connected to the first input end 11 to receive the second control signal V3SW, and the body region and the drain of the transistor M11 are commonly connected to the first output end 12. The gate, the body region and the drain of the transistor M12 are commonly connected to the first output end 12. The source of the transistor M12 is connected to the third input end 14 to receive the supply voltage VDDIO. The gate of the transistor M13 is connected to the third input end 14 to receive the supply voltage VDDIO, the body region and the drain of the transistor M13 are commonly connected to the first output end 12, and the source of the transistor M13 is connected to the second input end 13 to receive the first input signal PADIN.

When the I/O pad 500 operates in the output mode, the second control signal V3SW is equal to the ground voltage VSSIO, hence the transistor M11 is turned ON. The supply voltage VDDIO is transmitted to the first output end 12 through the transistor M11 which is turned ON, such that the voltage of the first control signal VNW provided by the first output end 12 is equal to the supply voltage VDDIO.

When the I/O pad 500 operates in the tolerance mode (which is included in the input mode), the voltage of the first input signal PADIN is equal to the third voltage HV. The transistor M13 is turned ON, and the first input signal PADIN is transmitted to the first output end 12 through the transistor M13 which is turned ON, such that the voltage of the first control signal VNW provided by the first output end 12 is equal to the third voltage HV.

Figure 6A:
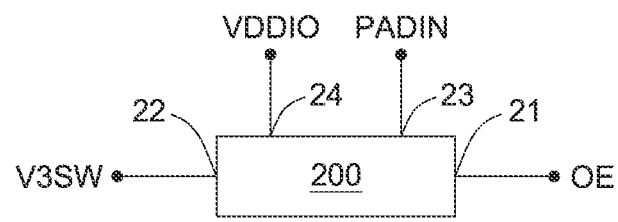
FIG. 6A is a block diagram of the second control circuit 200 of the I/O circuit 1000 in FIG. 1.

FIG. 6A is a block diagram of the second control circuit 200 of the I/O circuit 1000 in FIG. 1. Referring to FIG. 6A, in addition to the first input end 21 and the first output end 22, the second control circuit 200 further has a second input end 23 and a third input end 24. The first input end 21 of the second control circuit 200 receives the output enable signal OE, the second input end 23 receives the first input signal PADIN, the third input end 24 receives the supply voltage VDDIO, and the first output end 22 provides the second control signal V3SW.

Figure 6B:
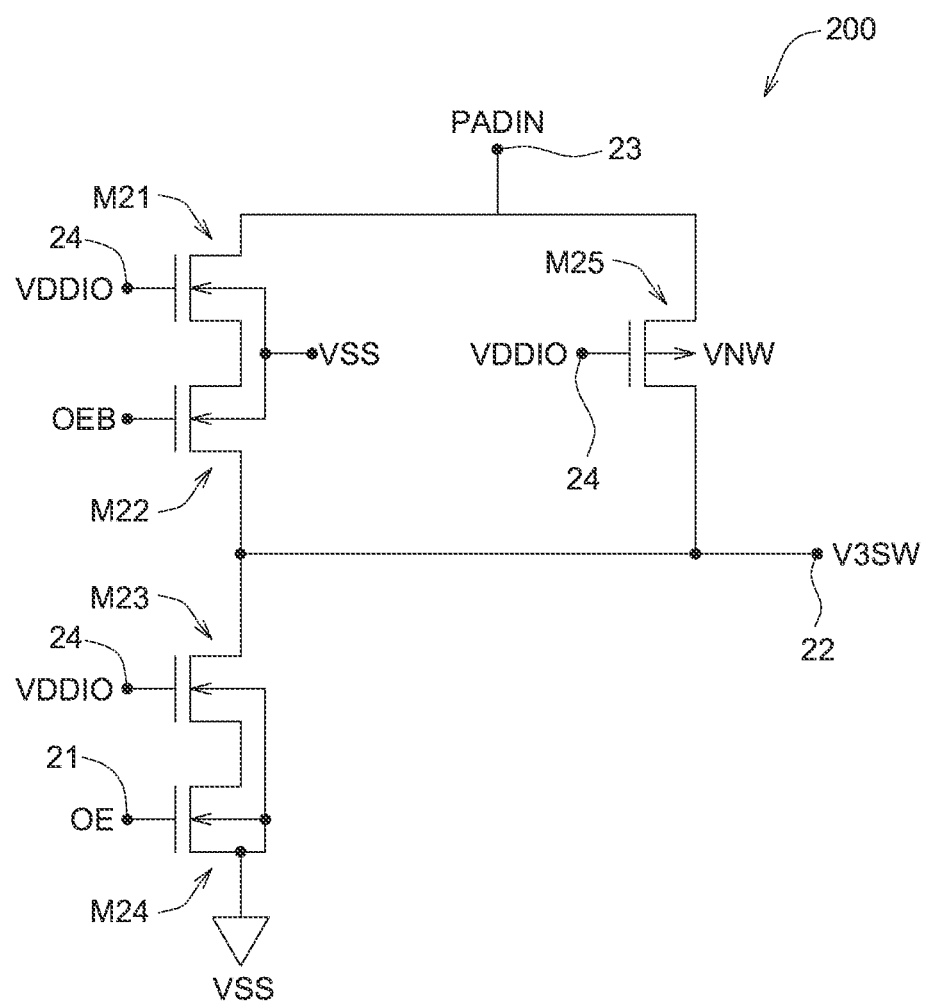
FIG. 6B is a circuit diagram of the second control circuit 200 in FIG. 6A.

FIG. 6B is a circuit diagram of the second control circuit 200 in FIG. 6A. Referring to FIG. 6B, the second control circuit 200 includes five transistors M21~M25. Each of the transistors M21~M24 is i.e., an N-type transistor, and the transistor M25 is i.e., a P-type transistor.

The respective gates of the transistor M21 and the transistor M23 are connected to the third input end 24 to receive the supply voltage VDDIO. The gate of the transistor M24 is connected to the first input end 21 to receive the output enable signal OE. The gate of the transistor M22 receives the output enable complementary signal OEB. The voltage of the output enable complementary signal OEB is complementary to the voltage of the output enable signal OE. The drain of the transistor M21 is connected to the second input end 23 to receive the first input signal PADIN, and the drain of the transistor M23 and the source of the transistor M22 are connected to the first output end 22 to provide the second control signal V3SW.

The respective body regions of the transistor M21, the transistor M22, the transistor M23 and the transistor M24, and the source of the transistor M24, all receive the second voltage VSS. The source of the transistor M25 is connected to the second input end 23 to receive the first input signal PADIN. The gate of the transistor M25 is connected to the third input end 24 to receive the supply voltage VDDIO. The body region of the transistor M25 is connected to the first control signal VNW. The drain of the transistor M25 is connected to the first output end 22 to provide the second control signal V3SW.

When the I/O pad 500 operates in the output mode, the output enable complementary signal OEB is equal to the second voltage VSS, hence the transistor M22 is turned OFF. The output enable signal OE is equal to the first voltage VDD, hence the transistor M24 is turned ON. Moreover, the gate of the transistor M23 receives the supply voltage VDDIO, hence the transistor M23 is turned ON. The voltage of the first output end 22 is reduced to the second voltage VSS through the transistor M23 and the transistor M24 which are turned ON, hence the voltage of the second control signal V3SW provided by the first output end 22 is equal to the second voltage VSS, which is also equal to the ground voltage VSSIO.

When the I/O pad 500 operates in the tolerance mode (which is included in the input mode), the output enable signal OE is equal to the second voltage VSS, and the output enable complementary signal OEB is equal to the first voltage VDD, hence the transistor M22 is turned ON. The gate of the transistor M21 receives the supply voltage VDDIO, hence the transistor M21 is turned ON. The output enable signal OE is equal to the second voltage VSS, hence the transistor M24 is turned OFF. The voltage of the second control signal V3SW provided by the first output end 22 is raised to as being equal to the voltage of the first input signal PADIN through the transistor M21 and the transistor M22 which are turned ON.

In the tolerance mode, the voltage of the first input signal PADIN is equal to the third voltage HV, such that the voltage of the second control signal V3SW provided by the first output end 22 is equal to the third voltage HV.

Figure 7A:
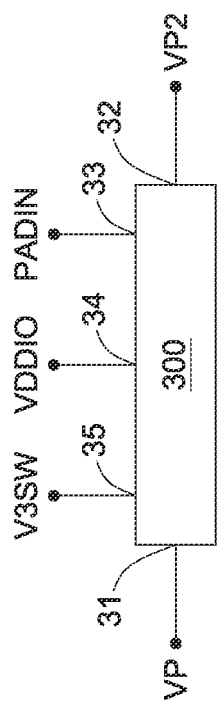
FIG. 7A is a block diagram of the third control circuit 300 of the I/O circuit 1000 in FIG. 1.

FIG. 7A is a block diagram of the third control circuit 300 of the I/O circuit 1000 in FIG. 1. Referring to FIG. 7A, in addition to the first input end 31 and the first output end 32 of the third control circuit 300, the third control circuit 300 further has a second input end 33, a third input end 34 and a fourth input end 35. The first input end 31 receives the first gate signal VP, the second input end 33 receives the first input signal PADIN, the third input end 34 receives the supply voltage VDDIO, the fourth input end 35 receives the second control signal V3SW, and the first output Terminal 32 provides the second gate signal VP2.

Figure 7B:
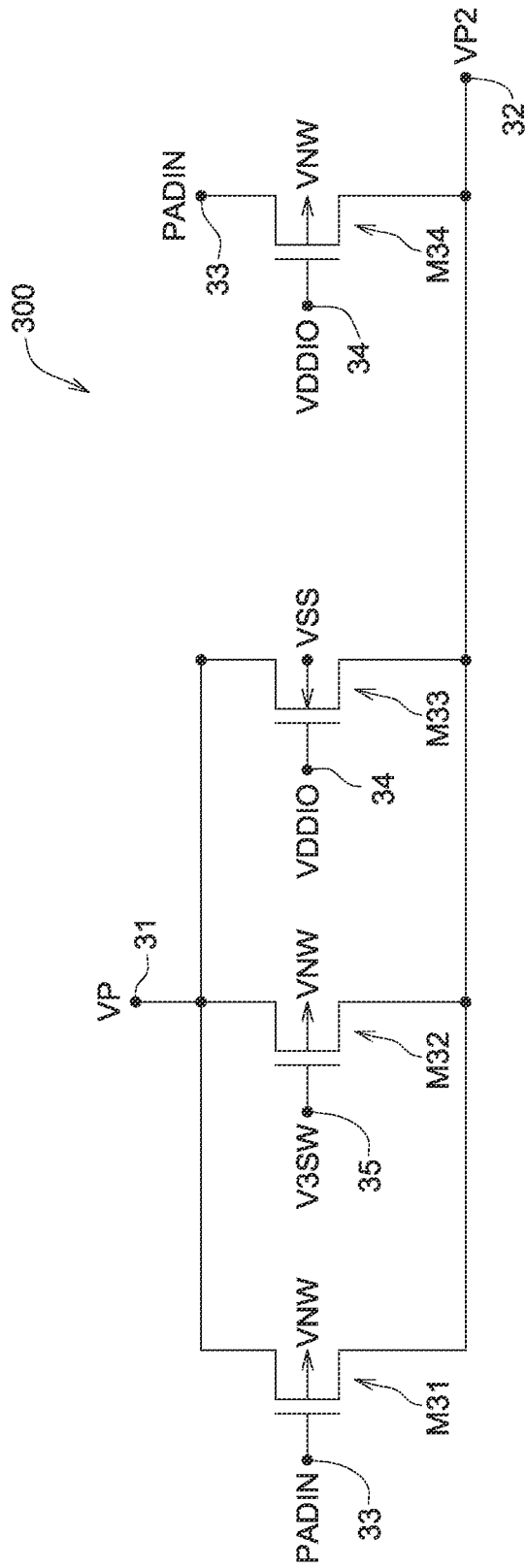
FIG. 7B is a circuit diagram of the third control circuit 300 in FIG. 7A.

FIG. 7B is a circuit diagram of the third control circuit 300 in FIG. 7A. Referring to FIG. 7B, the third control circuit 300 includes four transistors M31~M34. The transistor M33 is i.e., an N-type transistor, and the transistors M31, M32 and M34 are i.e., P-type transistors. The drains of the transistors M31 and M32 and the source of the transistor M33 are connected to the first input end 31 to receive the first gate signal VP, and the drain of the transistor M34 is connected to the second input end 33 to receive the first input Signal PADIN. The sources of the transistors M31, M32 and M34 and the drain of the transistor M33 are connected to the first output end 32 to provide the second gate signal VP2.

The gate of the transistor M31 is connected to the second input end 33 to receive the first input signal PADIN, the gate of the transistor M32 is connected to the fourth input end 35 to receive the second control signal V3SW, the gates of the transistors M33 and M34 are connected to the third input end 34 to receive the supply voltage VDDIO. The body regions of the transistors M31, M32 and M34 receive the first control signal VNW, and the body region of the transistor M33 receives the second voltage VSS.

When the I/O pad 500 operates in the normal input mode, the voltage of the second control signal V3SW provided by the first output end 22 of the second control circuit 200 is equal to the second voltage VSS and also equal to the ground voltage VSSIO. Therefore, the transistor M32 is turned ON, and the voltage of the second gate signal VP2 provided by the first output end 32 of the third control circuit 300 is raised to be equal to the voltage of the first gate signal VP, through the transistor M32 which is turned ON. Therefore, the voltage of the second gate signal VP2 is equal to the voltage of the first gate signal VP. When a logic value "1" is inputted through the I/O pad 500, the voltages of the second gate signal VP2 and the first gate signal VP are both equal to the ground voltage VSSIO. When a logic value "0" is inputted through the I/O pad 500, the voltages of the second gate signal VP2 and the first gate signal VP are both equal to the supply voltage VDDIO.

It will be apparent to those skilled in the art that various modifications and variations may be made to the disclosed embodiments. It is intended that the specification and examples be considered as exemplary only, with a true scope of the disclosure being indicated by the following claims and their equivalents.

What is claimed is:

1. An input/output circuit (I/O circuit), comprising:
    an input/output pad (I/O) pad), having a pad voltage, and having a plurality of operating modes, the operating modes comprise an input mode and an output mode, and the input mode comprises a normal input mode and a tolerance mode;
    a first control circuit, for providing a first control signal in response to the pad voltage and a supply voltage;
    a first P-type transistor, having a first source, a first drain, a first gate and a first body region, the first source receives the supply voltage, and the first body region receives the first control signal; and
    a second P-type transistor, having a second source, a second drain, a second gate and a second body region, the second source is connected to the first drain of the first P-type transistor, the second drain is connected to the I/O pad, the second body region receives the first control signal,
    wherein, when the I/O pad operates in the input mode, a change of a voltage of the first gate of the first P-type transistor and a change of a voltage of the second gate of the second P-type transistor are synchronized with a change of a voltage of the first body region of the first P-type transistor and a change of a voltage of the second body region of the second P-type transistor, and when the pad voltage is lower than or equal to the supply voltage the I/O pad operates in the normal input mode of the input mode, and when the pad voltage is higher than the supply voltage the I/O pad operates in the tolerance mode of the input mode, a voltage of the first control signal is equal to the pad voltage.

2. The I/O circuit according to claim 1, wherein, when the I/O pad operates in the tolerance mode:
    the pad voltage is equal to a third voltage, and the third voltage is higher than the supply voltage;
    the voltage of the first control signal is equal to the third voltage; and
    the voltage of the first gate of the first P-type transistor and the voltage of the second gate of the second P-type transistor are both equal to the third voltage, and the voltage of the first body region of the first P-type transistor and the voltage of the second body region of the second P-type transistor are both equal to the third voltage.

3. The I/O circuit according to claim 1, wherein, when the I/O pad operates in the normal input mode and a logic value "1" is inputted through the I/O pad:
    the voltage of the first control signal is equal to the supply voltage;
    the pad voltage is equal to the supply voltage; and
    the voltage of the first gate of the first P-type transistor and the voltage of the second gate of the second P-type transistor are both equal to the supply voltage, and the voltage of the first body region of the first P-type transistor and the voltage of the second body region of the second P-type transistor are both equal to the supply voltage.

4. The I/O circuit according to claim 1, wherein, the first control circuit further provides the first control signal in response to a second control signal, and the first control circuit comprising:

a first transistor, a gate of the first transistor receives the second control signal, and a body region and a drain of the first transistor provide the first control signal;

a second transistor, a gate, a body region, and a drain of the second transistor provide the first control signal, and a source of the second transistor receives the supply voltage; and a third transistor, a gate of the third transistor receives the supply voltage, a body region and a drain of the third transistor provide the first control signal, a source of the third transistor receives a first input signal, the drain of the third transistor is connected to the drain of the first transistor and the drain of the second transistor, wherein, the I/O pad provides the first input signal, and a voltage of the first input signal is equal to the pad voltage.

5. The I/O circuit according to claim 4, wherein:

when the I/O pad operates in the output mode, the second control signal is equal to a ground voltage, the ground voltage is lower than the supply voltage, the first transistor is turned ON, such that the voltage of the first control signal is equal to the supply voltage; and when the I/O pad operates in the tolerance mode, the pad voltage and the voltage of the first input signal are both equal to a third voltage, the third voltage is higher than the supply voltage, the third transistor is turned ON, such that the voltage of the first control signal is equal to the third voltage.

6. The I/O circuit according to claim 2, further comprising:

a second control circuit, for providing the second control signal in response to the pad voltage, the supply voltage and an output enable signal, the second control circuit comprising:

a fourth transistor, a drain of the fourth transistor receives the first input signal, and a gate of the fourth transistor receives the supply voltage;

a fifth transistor, a drain of the fifth transistor is connected to a source of the fourth transistor, and a source of the fifth transistor provides the second control signal;

a sixth transistor, a drain of the sixth transistor is connected to the source of the fifth transistor to provide the second control signal, a gate of the sixth transistor receives the supply voltage;

a seventh transistor, a drain of the seventh transistor is connected to a source of the sixth transistor, a gate of the seventh transistor receives the output enable signal; and an eighth transistor, a source of the eighth transistor is connected to the drain of the fourth transistor to receive the first input signal, and a gate of the eighth transistor receives the supply voltage.

7. The I/O circuit according to claim 6, wherein:

when the I/O pad operates in the output mode, the output enable signal is equal to a first voltage, the seventh transistor is turned ON, the sixth transistor is turned ON, and a voltage of the second control signal is equal to a second voltage, the second voltage is lower than the first voltage; and when the I/O pad operates in the tolerance mode, the output enable signal is equal to the second voltage, the fifth transistor is turned ON, and the voltage of the second control signal is equal to the voltage of the first input signal.

8. The I/O circuit according to claim 1, wherein, the first gate of the first P-type transistor and the second gate of the second P-type transistor both receive a second gate signal, when the I/O pad operates in the input mode, a change of a voltage of the second gate signal is synchronized with a change of the voltage of the first control signal.

9. The I/O circuit according to claim 8, further comprising:

a third control circuit, for providing the second gate signal in response to the pad voltage, the supply voltage and a first gate signal, wherein, when the I/O pad operates in the normal input mode and a logic value "0" is inputted through the I/O pad, the voltage of the second gate signal and the voltage of the first gate signal are both equal to the supply voltage, when the I/O pad operates in the normal input mode and a logic value "1" is inputted through the I/O pad, the voltage of the second gate signal and the voltage of the first gate signal are both equal to a ground voltage, the ground voltage is lower than the supply voltage.

10. The I/O circuit according to claim 9, further comprising:

a driving circuit, for providing the first gate signal in response to an output enable signal and an output data signal.

11. The I/O circuit according to claim 1, further comprising:

a first N-type transistor, having a third source, a third drain, a third gate and a third body region, the third drain is connected to the second drain of the second P-type transistor and the I/O pad, the third body region receives a ground voltage; and a second N-type transistor, having a fourth source, a fourth drain, a fourth gate and a fourth body region, the fourth drain is connected to the third source of the first N-type transistor, the fourth source is connected to the fourth body region and the third body region of the first N-type transistor to receive the ground voltage, wherein, the ground voltage is lower than the supply voltage.

12. The I/O circuit according to claim 11, wherein, the fourth gate of the second N-type transistor receives a third gate signal, and when the I/O pad operates in the input mode, the voltage of the third gate signal is equal to the ground voltage.

13. The I/O circuit according to claim 12, further comprising:

a driving circuit, for providing the third gate signal in response to an output enable signal and an output data signal.

* * * * *